(12) United States Patent
Schmitz

(10) Patent No.: US 6,995,984 B2
(45) Date of Patent: Feb. 7, 2006

(54) METHOD FOR PRODUCING A LARGE-MASS OHMIC RESISTOR FOR PROTECTING ELECTRONIC ASSEMBLIES FROM SURGES, AND AN ELECTRONIC ASSEMBLY

(75) Inventor: Gerd Schmitz, Troisdorf (DE)

(73) Assignee: Moeller GmbH, Bonn (DE)

( * ) Notice: Subject to any disclaimer, the term of this patent is extended or adjusted under 35 U.S.C. 154(b) by 253 days.

(21) Appl. No.: 10/362,722

(22) PCT Filed: Jun. 30, 2001

(86) PCT No.: PCT/EP01/07505

§ 371 (c)(1),
(2), (4) Date: Feb. 26, 2003

(87) PCT Pub. No.: WO02/19349

PCT Pub. Date: Mar. 7, 2002

(65) Prior Publication Data

US 2004/0022000 A1 Feb. 5, 2004

(30) Foreign Application Priority Data

Aug. 31, 2000 (DE) ................................ 100 42 764

(51) Int. Cl.
*H05K 1/16* (2006.01)
*H05K 3/30* (2006.01)
(52) U.S. Cl. ...................... 361/765; 338/307; 338/308; 427/103; 29/620
(58) Field of Classification Search ............... 361/91.2, 361/738, 765, 766, 782, 793; 174/256–258, 174/260; 338/307, 308; 257/724
See application file for complete search history.

(56) References Cited

U.S. PATENT DOCUMENTS

| | | | | |
|---|---|---|---|---|
| 3,909,680 | A | * 9/1975 | Tsunashima | ................. 361/748 |
| 3,973,170 | A | * 8/1976 | Hogan | .......................... 361/41 |
| 4,087,779 | A | 5/1978 | Oka | ............................ 338/327 |
| 4,164,778 | A | 8/1979 | Sawari et al. | ............... 361/409 |
| 4,533,972 | A | * 8/1985 | Ohashi | ........................ 361/156 |
| 4,647,900 | A | * 3/1987 | Schelhorn et al. | .......... 338/314 |
| 5,189,284 | A | * 2/1993 | Takahashi et al. | .......... 219/543 |
| 5,557,252 | A | 9/1996 | Ariyoshi | ..................... 338/195 |
| 5,734,314 | A | 3/1998 | Kuo | ............................ 338/308 |
| 6,002,564 | A | 12/1999 | Ohtsuchi | ..................... 361/93 |
| 6,108,212 | A | * 8/2000 | Lach et al. | .................. 361/768 |

(Continued)

FOREIGN PATENT DOCUMENTS

DE 2364520 7/1974

(Continued)

OTHER PUBLICATIONS

Sera, N. et al.: "Thin panel switch with LED for cellular telephones"; National Technical Report, Aug. 1996, Matsushita Electric Industrial Co., Japan, vol. 42, No. 4, pp. 50-56 (see International Search Report for PCT/EP01/07505, Abstract).

(Continued)

*Primary Examiner*—John B. Vigushin
(74) *Attorney, Agent, or Firm*—Davidson, Davidson & Kappel, LLC

(57) ABSTRACT

The invention relates to an electronic assembly, in particular for low power consumption electric switching devices such as low power contactors, time relays or the like. In order to provide protection against input current pulses, an ohmic resistor (6) is provided in the form of a resistive layer that is applied by pressing.

26 Claims, 3 Drawing Sheets

U.S. PATENT DOCUMENTS 6,356,455 B1 * 3/2002 Carpenter ................... 361/793
6,458,847 B1 * 10/2002 Wilson et al. .............. 338/320
6,631,551 B1 * 10/2003 Bowles et al. ................ 29/620

FOREIGN PATENT DOCUMENTS

| DE | 4100865 | 7/1992 |
| --- | --- | --- |
| DE | 4339790 | 6/1995 |
| DE | 4446099 | 10/1996 |
| JP | 2306686 | 12/1990 |
| JP | 05-013914 A * | 1/1993 |
| JP | 10247769 | 9/1998 |

OTHER PUBLICATIONS

DIN EN 61000-4-5, Dec. 2001, 43 pages total (German-language version of IEC1000-4-5, discussed in paragraph 3 of specification).

International Search Report for PCT/EP01/07505, dated Nov. 21, 2001.

* cited by examiner

Prior Art ness of the surface to be printed on. A substrate which is as flat as possible is optimum for screen printing. Given that, according to the present invention, a carbon film is to be printed on the printed circuit board between two terminal pads, the copper layer present there between the two terminal pads is removed.

METHOD FOR PRODUCING A LARGE-MASS OHMIC RESISTOR FOR PROTECTING ELECTRONIC ASSEMBLIES FROM SURGES, AND AN ELECTRONIC ASSEMBLY

BACKGROUND

The present invention relates to a method for producing a large-mass ohmic resistor for protecting electronic assemblies from surges and to an electronic assembly having means for protection from surge voltage or surge current pulses.

In electronic assemblies, protection against high-energy overvoltage spikes is necessary to avoid destruction of the components.

IEC1000-4-5 for testing immunity to surge voltages contains information on the limiting values and waveforms for corresponding tests. Usual test levels are from 0.5 to 4 kV or higher, depending on the required overvoltage categoxy of the electronic assemblies. In the unloaded condition, the surge voltage pulse (surge load) has a double exponential waveform having a front time of 1.2 $\mu$s and a time to half-value of 50 $\mu$s. In this context, the front time is defined as the rise time of a surge (voltage) pulse from 10% to 90% of its amplitude peak value, whereas the time to half-value is defined as the time of the surge (voltage) pulse from the maximum (100%) of the amplitude peak value to 50% thereof. In line-to-line testing, an impcdancc of 2Ω is specified as the internal impedanec of the surge generator.

Generally, it is not possible to design the components for such an overvoltage. Therefore, it is usual to limit the voltage at the electronic assembly using voltage-limiting components, for example, by varistors or suppressor diodes, which are connected in parallel to the component (FIG. 1). Due to the low internal impedance of the test generator, very large currents flow via the voltage-limiting protection element. In the process, a very large pulse energy must be absorbed. To achieve a high protection level, it is therefore necessary to use a relatively large, voluminous varistor having a corresponding absorbing capacity. Moreover, the clamping voltage, i.e., the voltage limited by the protection element, increases as a function of the non-linearity component of the protection element and of the current pulse level.

As an example, in an application using a 275V varistor at a pulse voltage of 4 kV with a phase angle of 90° to the line voltage, a maximum pulse current of about 1700 A occurs, resulting in a maximum clamping voltage of 900V. Since IEC1000-4-5 requires a sequence of twenty pulses spaced sixty seconds apart, a varistor having a minimum diameter of 14 mm is required for this load. In devices having a lower power requirement, it is therefore common practice to increase the input impedance of the electronic assembly by means of a series resistor (FIG. 2) to reduce the pulse currents. In the example mentioned above, given an input impedance of about 50Ω, the pulse current is limited to a maximum value of 70 A. On one hand, this results in a lower clamping voltage of 750V maximum and, on the other hand, the varistor can be reduced to a disk diameter of 5 mm here. Because of this, it is also possible to use varistors in SMD technology (surface mounted device), which are currently only manufactured up to a maximum pulse load capacity of 1200 A (single pulse).

In this context, it is a disadvantage that a resistor having a very high pulse immunity has to be used for the series resistor. In the example mentioned above, the resistor must withstand a pulse power of about 240 kW. However, modern resistors in film technology are unsuitable for such a pulse load. Carbon composite resistors, which have excellent pulse immunity, are nowadays hardly produced anymore. Therefore, only wire-wound resistors are suitable as a series resistor. However, for the example mentioned above, a size having a power rating of 4 Watts minimum is required, depending on the type of resistor. However, these resistors have a very voluminous design and are available as through-hole mounted devices only. Moreover, the expenses are higher here than when using a larger varistor for "hard clamping", that is, for a suppressor circuit without additional series resistor.

Using SMD wire-wound resistors, which are currently manufactured with a maximum power rating of 2.5 W, a surge load of 2 kV maximum can be achieved.

Furthermore, the general use of printed series resistors for LEDs is described in "National Technical Report"—"Thin panel switch", August 1996, Matsushita Electric Industrial Co, Japan, Bd. 42, Nr. 4, pages 50–56.

SUMMARY OF THE INVENTION

An object of the present invention is to provide a method for producing a large-mass ohmic resistor and an electronic assembly allowing for a smaller size for a specific surge load.

The present invention provides an electronic assembly comprising a printed circuit board. The printed circuit board includes at least one conductive track; a plurality of terminal pads; at least one semiconductor component; at least one ohmic resistor including a printed resistive film and configured to limit pulse-shaped input currents; and a filling layer arranged in a region between a first and a second of the plurality of terminal pads so as to form a transitionless flat surface for the resistive film.

The method according to the present invention provides a large-mass ohmic resistor which has a high pulse immunity and allows for a small size. To this end, a resistive film, in particular a carbon film, is deposited on a printed-circuit board between two terminal pads. This is advantageously done using the screen-printing technique. Preferably, the resistive film is made by multilayer printing. After the resistive film is deposited, it is baked and thus fixed on the substrate (printed-circuit board). Until now, carbon prints have only been used to substitute gold at the contact points or to make crossing conductive tracks (cross-overs).

In order to avoid a reduction in cross-section at the connection or transition points between the resistive film and the terminal pad(s), the region of the printed circuit board between the terminal pads can be provided with a filling layer in the region of the resistive film to be deposited. In this manner, a flat substrate surface is provided for the resistive film. A stepped transition region in the edge region of the terminal pads is thus avoided. A further possibility of optimizing such a transition region can be achieved by embedding the terminal pads in, for example, pre-milled recesses of the printed circuit board. In this manner too, a flat substrate surface is achieved for the resistive film.

The electronic assembly according to the present invention constitutes the assembly for electrical devices having a power consumption preferably below 10 VA so that the power loss in the series resistor during nominal operation remains negligibly small (for 10 VA, 230V and Rv=50Ω, Pv <0.1 W). The assembly is especially suitable for low-power contactors, timing relays, and the like. In this context, the assembly is designed as a substrate element in the form of a printed circuit board on which are located conductive tracks and terminal pads for the connection of components, the printed circuit board being preferably provided with a resistive film on one side and, on the other side, including components corresponding to the desired circuit function. The resistive film is preferably designed as a carbon film, as described above. The components include semiconductor components and at least one ohmic resistor acting as a series resistor. This series resistor is formed by the resistive film placed on the back of the printed circuit board. This resistive film is plated through to the front, and there it is connected into the electronic circuit as a series resistor for limiting pulse-shaped input currents. In this manner, the electronic circuit is effectively protected from high-energy input voltage or input current spikes.

BRIEF DESCRIPTION OF THE DRAWINGS

The present invention will be described and illustrated in greater detail below based on exemplary embodiments with reference to the drawings, in which.

DETAILED DESCRIPTION

Figure 1:
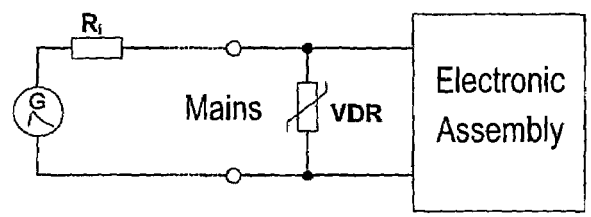
FIG. 1 shows a first possible input protection circuit of an electronic assembly according to the prior art.
Figure 2:
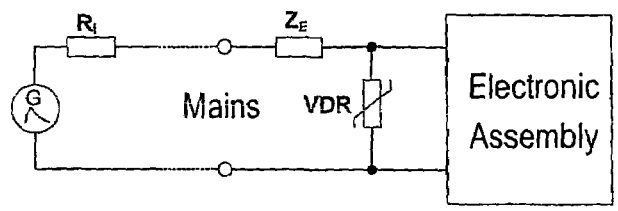
FIG. 2 shows a further possible input protection circuit of an electronic assembly according to the prior art.
Figure 3:
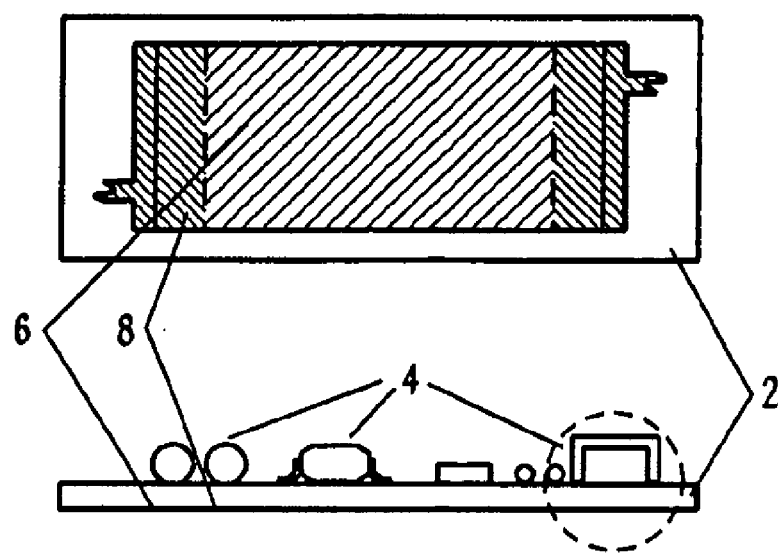
FIG. 3 shows an electronic assembly according to the present invention.
Figure 4:
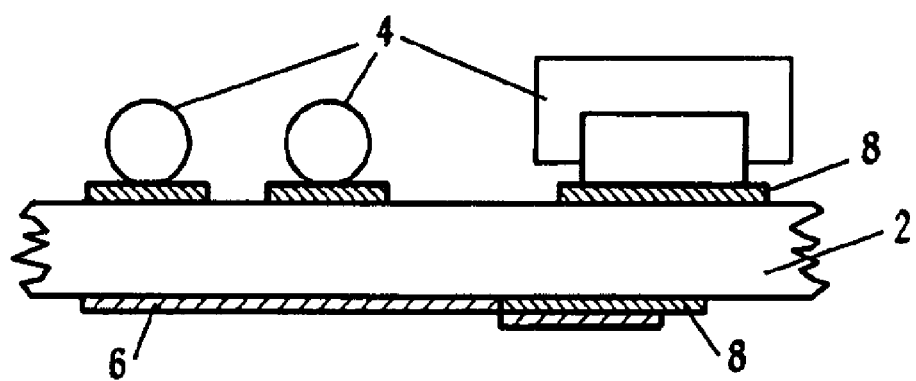
FIG. 4 is a detail view corresponding to FIG. 3.
Figure 5:
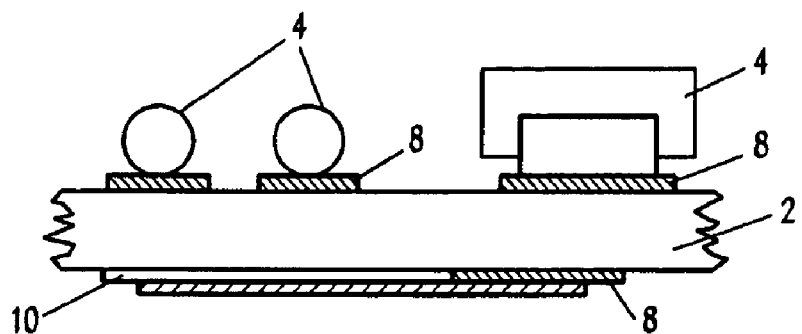
FIG. 5 is a further detail view corresponding to FIG. 3.

According to FIG. 3, the electronic assembly includes a printed circuit board 2, diverse components 4, such as semiconductors as well as active and passive components. In order to protect components 4, in particular the sensitive semiconductors, the electronic assembly features a series resistor 6 on the incoming side. Series resistor 6 is preferably connected in series with at least one of the input connections (input terminals). According to the present invention, this series resistor 6 is designed in the form of an ohmic resistive film, in particular, a carbon film. Preferably, the resistive film has a multilayer design and is possibly mixed with insulating pastes to attain the desired resistance value. The resistive film is preferably designed as a carbon ink (e.g. 1-component carbon ink SD 2841 HAL or SD 2841 HAL-BW from the Lackwerke Peters Company) and advantageously printed on printed circuit board 2 using the screen-printing technique, and subsequently baked. Through multiple printing, it is possible to increase the layer thickness of resistor 6 and thus the pulse immunity. Advantageously, one side of the printed circuit board is only equipped with components 4 while the other side of the printed circuit board is intended for printing with the resistive film. This allows for a small size of an assembly of that kind. For the interconnection of series resistor 6 (resistive film), terminal pads 8 of both sides of the printed circuit board are plated through in known manner.

In order to avoid a reduction in cross-section at the connection or transition points between the resistive film and terminal pad(s) 8, the region of printed circuit board 2 between terminal pads 8 can be provided with a filling layer 10 in the region of the resistive film to be deposited. In this manner, a flat substrate surface is provided for the resistive film. A stepped transition region in the edge region of terminal pads 8 is thus avoided.

A further possibility of optimizing such a transition region can be achieved by embedding the terminal pads in, for example, pre-milled recesses of the printed circuit board (not shown). In this manner too, a flat substrate surface is achieved for the resistive film.

In a carbon film of area 0.002 m/Ωmm$^2$, a layer thickness of 30 μm and a resistor size of 7*20 mm, a resistance value of approximately 47Ω is achieved. In this context, the active mass of resistor 6 is about 6.5 mg, given a density of 1.55 g/cm$^3$. In this context, given a permissible short-term temperature limit of approximately 300° C., a calculated, purely adiabatic absorption capacity of 1.6 Ws is achieved. This corresponds to a current pulse of about 36 A for the waveform mentioned at the outset, or to a surge load of about 2500V. However, empirically determined values indicate a markedly higher pulse load capacity because of the excellent thermal coupling of the carbon film to printed circuit board 2.

In practice, the weak point is the termination of the carbon film, i.e., the connection of the resistive film to the copper layer of the printed circuit board. As can be seen from the detail in FIG. 3, a step occurs at the transition of the printed carbon film from the copper layer of terminal pad 8 to circuit board substrate 2. Due to this, the effective resistive film is reduced at this location, and therefore the pulse load capacity is strongly reduced. Moreover, using the printing method, it is not possible to achieve optimum homogeneity at this location.

The reduction of the cross-section can be reduced by using a printer circuit board 2 having as thin a copper plating as possible (for example, 17 μm instead of the 35 μm standard coating) and in that an intermediate layer, for example, a solder resist, which corresponds to the copper thickness is printed on the intermediate surface.

Figure 6A:
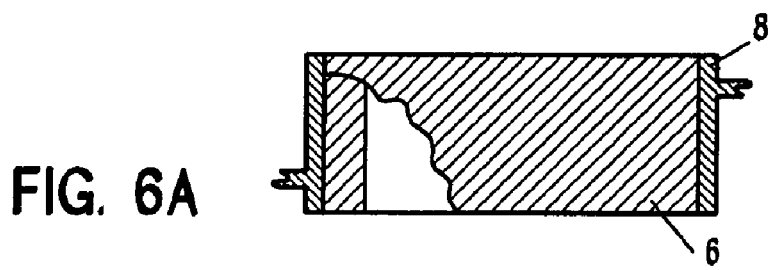
FIGS. 6a–c are top views of the film resistor according to FIGS. 3–5.
Figure 6B:
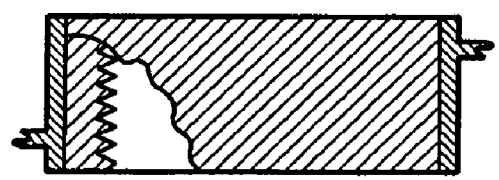
Figure 6C:
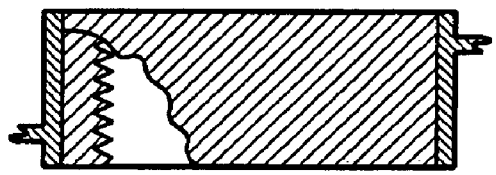
Figure 7:
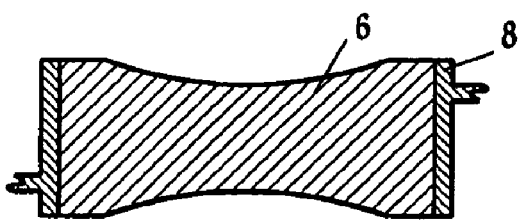
FIG. 7 shows a further top view according to FIGS. 3–5.

Moreover, the transition area from the copper surface to the resistive film can be increased by a serrated (FIG. 6b) or waved (FIG. 6c) shape of terminal pad 8.

A further way to relieve the termination is to taper the resistive film toward the middle of resistor 6. Through the tapering, the resistance value can be increased, resulting in a lower pulse current, or the effective width of the termination can be increased while maintaining same the resistance value.

The present invention is not limited to the specific embodiments described above but is defined in scope by the appended claims. Thus, the application is not limited to the use of a carbon ink. In principle, all possible resistor pastes requiring a low baking or drying temperature (<200° C.) can be used. The nominal value of the resistor can be influenced within a wide range by the geometry of the print; however, the given example represents an excellent compromise between the pulse load capacity (here approximately 4 kV) and the power loss of the resistor during nominal operation. Thus, the power loss of an electronic assembly according to the present invention having a power consumption of 10 VA is approximately 100 mW. If the nominal resistance value can be increased, for example, in the case of an electronic assembly having a lower power consumption, then the mass, i.e., the surface of the carbon print can be reduced. In this context, the nominal resistance value can be achieved by reducing the conductance of the carbon ink by mixing with insulating pastes.

What is claimed is:

1. An electronic assembly comprising a printed circuit board, the printed circuit board including:

a substrate;
at least one conductive track;
a plurality of terminal pads;
at least one semiconductor component;
at least one ohmic resistor including a printed resistive film and configured to limit pulse-shaped input currents; and
a filling layer disposed on the substrate in a region between a first and a second of the plurality of terminal pads so as to form a transitionless flat surface for the resistive film;
wherein at least a portion of the filling layer and of the first and a second terminal pads are disposed between the substrate and the resistive film.

2. The electronic assembly as recited in claim 1 wherein the electronic assembly is for an electric switching device having a low power consumption.

3. The electronic assembly as recited in claim 2 wherein the electric switching device includes at least one of a contactor and a timing relay.

4. The electronic assembly as recited in claim 1 wherein filling layer includes a solder resist layer.

5. The electronic assembly as recited in claim 1 wherein the resistive film includes a carbon ink.

6. The electronic assembly as recited in claim 5 wherein the carbon ink includes a single-component carbon conductive ink.

7. The electronic assembly as recited in claim 1 wherein the first and second terminal pads are configured for connection of the resistive film and are embedded in the printed circuit board so as to form the transitionless flat surface.

8. The electronic assembly as recited in claim 1 wherein the first and second terminal pads include a surface-enlarging shape in a connection region.

9. The electronic assembly as recited in claim 8 wherein the surface-enlarging shape includes at least one of a serrated and a wave shape.

10. The electronic assembly as recited in claim 1 wherein the resistive film includes a tapering shape between the first and second terminal pads.

11. The electronic assembly as recited in claim 1 wherein the resistive film is disposed on a first side of the printed circuit board and wherein the at least one semiconductor component includes a discrete component disposed on a second side of the printed circuit board.

12. The electronic assembly as recited in claim 11 wherein the discrete component includes an SMD component.

13. An electronic assembly comprising a printed circuit board, the printed circuit board including:
at least one conductive track;
at least one semiconductor component;
at least one ohmic resistor including a printed resistive film and configured to limit pulse-shaped input currents; and
a plurality of terminal pads, a first and a second of the plurality of terminal pads being disposed in recesses of the printed circuit board so as to form a transitionless flat surface for the resistive film;
wherein the first and second terminal pads include a surface-enlarging shape in a connection region.

14. The electronic assembly as recited in claim 13 wherein the surface-enlarging shape includes at least one of a serrated and a wave shape.

15. A method for producing a large-mass ohmic series resistor having a high pulse immunity, comprising:
providing a printed circuit board having at least two terminal pads and a substrate;
providing a resistive film on the printed circuit board; and
providing a filling layer disposed in a region between the terminal pads so as to form a transitionless flat surface for the resistive film;
wherein at least a portion of the filling layer and of the first and a second terminal pads are disposed between the substrate and the resistive film.

16. The method as recited in claim 15 wherein the providing is performed using a screen-printing technique.

17. The method as recited in claim 15 wherein the resistive film includes a carbon layer.

18. The method as recited in claim 15 wherein the printed circuit board is part of an electronic assembly for an electric switching device having a low power consumption.

19. The method as recited in claim 18 wherein the electric switching device includes at least one of a contactor and a timing relay.

20. The method as recited in claim 15 wherein the resistive film includes a carbon ink.

21. The method as recited in claim 20 wherein the carbon ink includes a single-component carbon conductive ink.

22. The method as recited in claim 15 wherein the first and second terminal pads are configured for connection of the resistive film and are embedded in the printed circuit board so as to form the transitionless flat surface.

23. The method as recited in claim 15 wherein the resistive film includes a tapering shape between the first and second terminal pads.

24. The method as recited in claim 15 wherein the printed circuit board includes at least one semiconductor component and the resistive film is disposed on a first side of the printed circuit board and wherein the at least one semiconductor component includes a discrete component disposed on a second side of the printed circuit board.

25. The electronic assembly as recited in claim 24 wherein the discrete component includes an SMD component.

26. A method for producing a large-mass ohmic series resistor having a high pulse immunity, comprising:
providing a printed circuit board having at least two terminal pads;
providing a resistive film on the printed circuit board; and
providing a filling layer arranged in a region between the terminal pads so as to form a transitionless flat surface for the resistive film;
wherein filling layer includes a solder resist layer.

* * * * *